(12) United States Patent
Fukuda

(10) Patent No.: US 7,057,946 B2
(45) Date of Patent: *Jun. 6, 2006

(54) SEMICONDUCTOR INTEGRATED CIRCUIT HAVING LATCHING MEANS CAPABLE OF SCANNING

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 280 days.

This patent is subject to a terminal disclaimer.

(21) Appl. No.: 10/662,309

(22) Filed: Sep. 16, 2003

(65) Prior Publication Data

US 2004/0042332 A1 Mar. 4, 2004

Related U.S. Application Data

(62) Division of application No. 09/993,603, filed on Nov. 27, 2001, now Pat. No. 6,639,850.

(30) Foreign Application Priority Data

Sep. 28, 2001 (JP) ............................. 2001-304750

(51) Int. Cl.
*G11C 7/00* (2006.01)

(52) U.S. Cl. .............. 365/189.12; 365/78; 365/230.08; 365/230.09; 365/239; 365/240; 714/727

(58) Field of Classification Search ........... 365/189.12, 365/189.05, 78, 194, 230.08, 230.09, 239, 365/240; 714/727

See application file for complete search history.

(56) References Cited

U.S. PATENT DOCUMENTS

| 6,154,396 | A | 11/2000 | Yabe et al. | |
|---|---|---|---|---|
| 6,343,365 | B1 * | 1/2002 | Matsuzawa et al. | ........ 714/726 |
| 6,408,414 | B1 | 6/2002 | Hatada | |
| 6,445,627 | B1 | 9/2002 | Nakahara et al. | |
| 6,639,850 | B1 * | 10/2003 | Fukuda | ................... 365/189.12 |
| 2001/0047499 | A1 | 11/2001 | Whetsel, Jr. | |
| 2002/0120895 | A1 | 8/2002 | Suzuki | |

FOREIGN PATENT DOCUMENTS

| JP | 6-66885 | 3/1994 |
|---|---|---|
| KR | 2000-0059512 | 10/2000 |

* cited by examiner

OTHER PUBLICATIONS

Jun Ohtani, et al. "A Shared Built-In Self-Repair Analysis for Multiple Embedded Memories," IEEE 2001 Custom Integrated Circuits Conference. 2001, pp. 187-190.

*Primary Examiner*—Richard Elms
*Assistant Examiner*—Toan Le
(74) *Attorney, Agent, or Firm*—Oblon, Spivak, McClelland, Maier & Neustadt, P.C.

(57) ABSTRACT

Circuits have a certain function. A plurality of first registers are connected in series, and shift stored data to respective adjacent registers in sequence. A plurality of second registers are connected in series, and shift stored data to respective adjacent registers in sequence. The plurality of first and second registers are connected in one-to-one correspondence to a plurality of input terminals or to a plurality of output terminals. A first scan input terminal is formed at one end of the plurality of first series-connected registers, and a first scan output terminal is formed at the other end. A second scan input terminal is formed at one end of the plurality of second series-connected registers, and a second scan output terminal is formed at the other end. An operation control circuit controls operations of the circuits and the plurality of first and second registers.

33 Claims, 6 Drawing Sheets

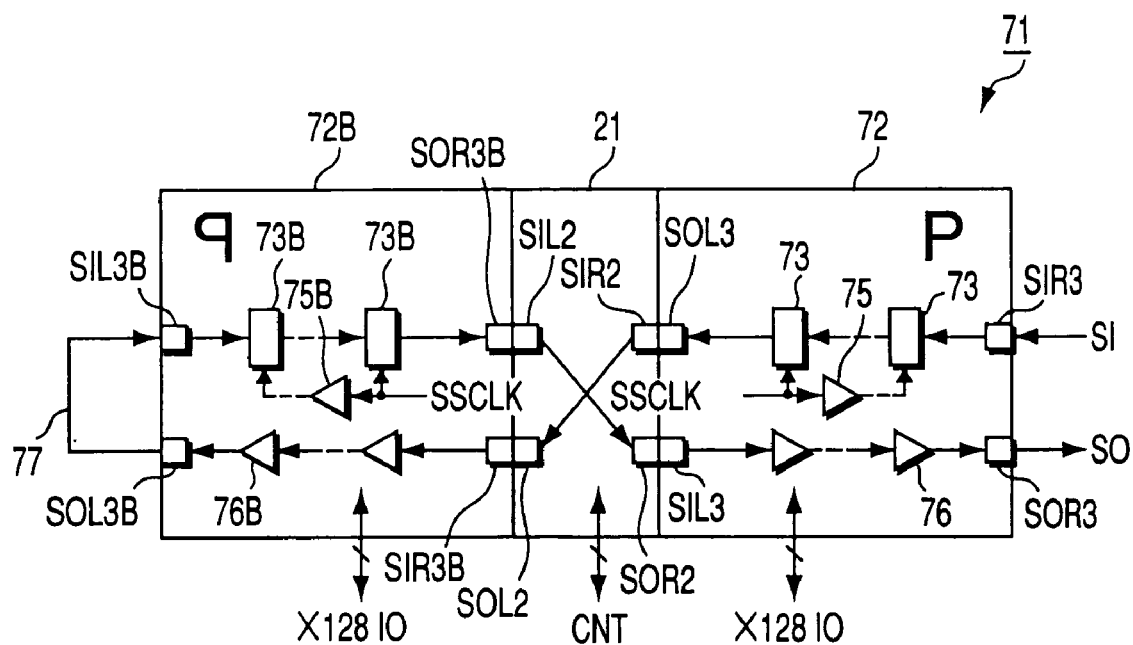
F I G. 11
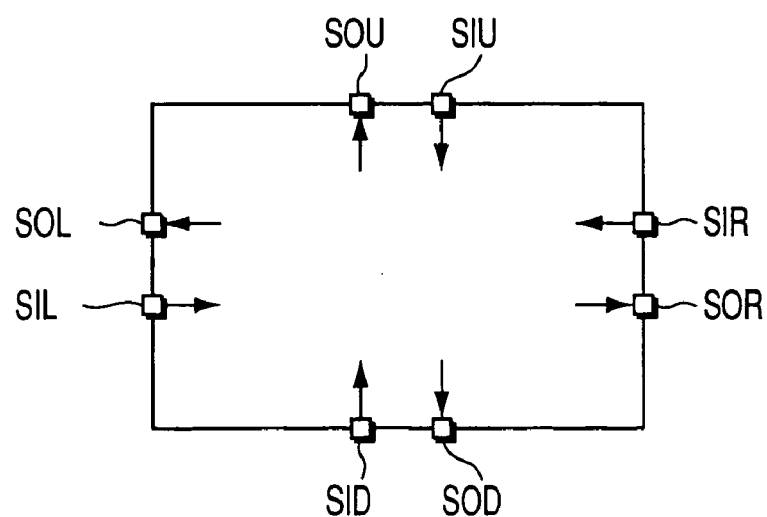
F I G. 12

SEMICONDUCTOR INTEGRATED CIRCUIT HAVING LATCHING MEANS CAPABLE OF SCANNING

CROSS-REFERENCE TO RELATED APPLICATIONS

This is a divisional application of parent application Ser. No. 09/993,603, filed Nov. 27, 2001, now U.S. Pat. No. 6,639,850. This application is based upon and claims the benefit of priority from the prior Japanese Patent Application No. 2001-304750, filed Sep. 28, 2001, and the entire contents of the parent application and the Japanese application are incorporated herein by reference.

BACKGROUND OF THE INVENTION

1. Field of the Invention

The present invention relates to a semiconductor integrated circuit having a latching means capable of scanning.

2. Description of the Related Art

In synchronous semiconductor integrated circuits which have been more and more complicated, the recent most popular technique is to use a latching circuit (scan chain) capable of scanning to test this latching circuit by separating only a certain function, thereby greatly reducing the test time. The latching means (scan chain) capable of scanning is a means in which a plurality of registers and the like are connected into one or a plurality of chains so that data stored in a preceding register can be shifted (scanned) to a succeeding register.

In particular, a macro cell for forming an embedded memory containing both a memory circuit and logic circuit has a large number of input/output terminals. Hence, it is essential to include the scanning function as described above to improve the fault detection ratio of the whole semiconductor integrated circuit (semiconductor chip).

FIG. 1 is a schematic view showing a method of realizing scan in a conventional macro cell. This macro cell 101 is for forming an embedded memory or the like. As shown in FIG. 1, the macro cell 101 has a large number of input/output terminals (to be referred to as IO terminals hereinafter) 102, so these IO terminals 102 are arranged with a spatial extension. Each IO terminal 102 has an input/output register (to be referred to as an IO register hereinafter) 103. These IO registers 103 have a scanning function to test data (an external path) input from the outside of this macro cell, and are connected in series.

A scan input terminal 104 is connected to one end of these IO registers 103. A scan output terminal 105 is connected to the other end of the IO registers 103. Data SI to be scanned is input to the input terminal 104, and scanned data SO is output from the scan output terminal 105. Although not shown, scan is executed by using a control input signal and a clock signal in addition to these data.

FIG. 2 is a view showing the arrangement of a conventional embedded memory macro. An example of the realization of scan in this embedded memory macro will be described below.

As shown in FIG. 2, this embedded memory macro 111 has the macro cell 101 shown in FIG. 1, an operation control circuit 112, and a macro cell 101B. This macro cell 101B is the mirror inversion of the macro cell 101 with respect to the operation control circuit 112. In an embedded memory macro, to increase the memory capacity and share the operation control circuit 112, the macro cells 101 and 101B are usually so arranged as to have a mirror inversion relationship on the two sides of the operation control circuit 112.

In each of the macro cells 101 and 101B, 128 IO registers and 128 IO terminals are arranged. At the right end of the macro cell 101, a scan input terminal 104 connected to the right end of the IO registers is formed. At the left end of the macro cell 101, a scan output terminal 105 connected to the left end of the IO registers is formed.

The operation control circuit 112 has an input/output line for inputting and outputting a control signal CNT and has a register for storing this control signal CNT. At the right end of the operation control circuit 112, a scan input terminal 113 connected to the register is formed. At the lower end of the operation control circuit 112, a scan output terminal 114 connected to the register is formed.

At the left end of the macro cell 101B, a scan input terminal 104B connected to the left end of the IO registers is formed. At the right end of the macro cell 101B, a scan output terminal 105B connected to the right end of the IO registers is formed. In addition, the scan output terminal 114 and the scan input terminal 104B are connected by a line 115.

The memory macro 111 configured as shown in FIG. 2 can achieve a memory macro scanning function by inputting data SI to be scanned to the scan input terminal 104 at the right end, and outputting scanned data SO from the scan output terminal 105B.

Unfortunately, the line 115 between the scan output terminal 114 and the scan input terminal 104B is a long line extending over the 128 IO terminals, and therefore deteriorates the performance of the scan operation. Also, this line 115 must be formed outside the memory macro. This interferes with automatization of the scan operation.

BRIEF SUMMARY OF THE INVENTION

A semiconductor device according to an aspect of the present invention comprises: circuits having a certain function; a plurality of input terminals which receive input data to the circuits from the outside; a plurality of output terminals which output data output from the circuits to the outside; a plurality of first registers connected in series, the plurality of first registers shifting stored data to respective adjacent registers in sequence, and the plurality of first registers being connected in one-to-one correspondence to the plurality of input terminals or to the plurality of output terminals; a plurality of second registers connected in series, the plurality of second registers shifting stored data to respective adjacent registers in sequence, and the plurality of second registers being connected in one-to-one correspondence to the plurality of input terminals or to the plurality of output terminals; a first scan input terminal formed at one end of the plurality of first series-connected registers; a first scan output terminal formed at the other end of the plurality of first series-connected registers; a second scan input terminal formed at one end of the plurality of second series-connected registers; a second scan output terminal formed at the other end of the plurality of second series-connected registers; and an operation control circuit which controls operations of the circuits and the plurality of first and second registers.

BRIEF DESCRIPTION OF THE SEVERAL VIEWS OF THE DRAWING

FIG. 11 is a diagram showing an array block which configures a semiconductor integrated circuit of the fourth embodiment of the present invention; and FIG. 12 is a diagram showing the installation locations of scan IO terminals applicable to each embodiment of the present invention.

DETAILED DESCRIPTION OF THE INVENTION

Figure 1:
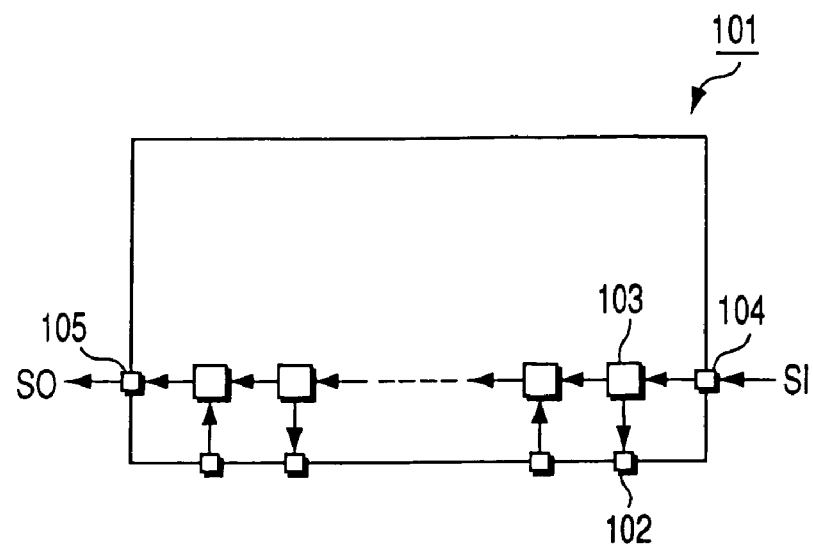
FIG. 1 is a diagram showing a method of realizing scan in a conventional array block.
Figure 2:
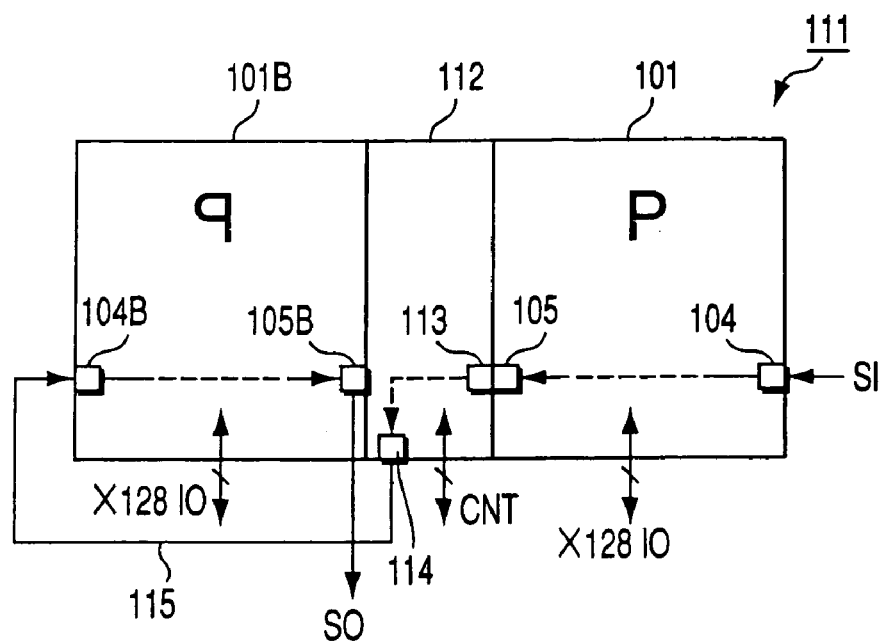
FIG. 2 is a diagram showing the arrangement of a conventional memory macro.

Embodiments of the present invention will be described below with reference to the accompanying drawing. In the following explanation, the same reference numerals denote the same parts throughout the drawing.

First Embodiment

First, an array block constructing a semiconductor integrated circuit of the first embodiment of the present invention will be described below.

Figure 3:
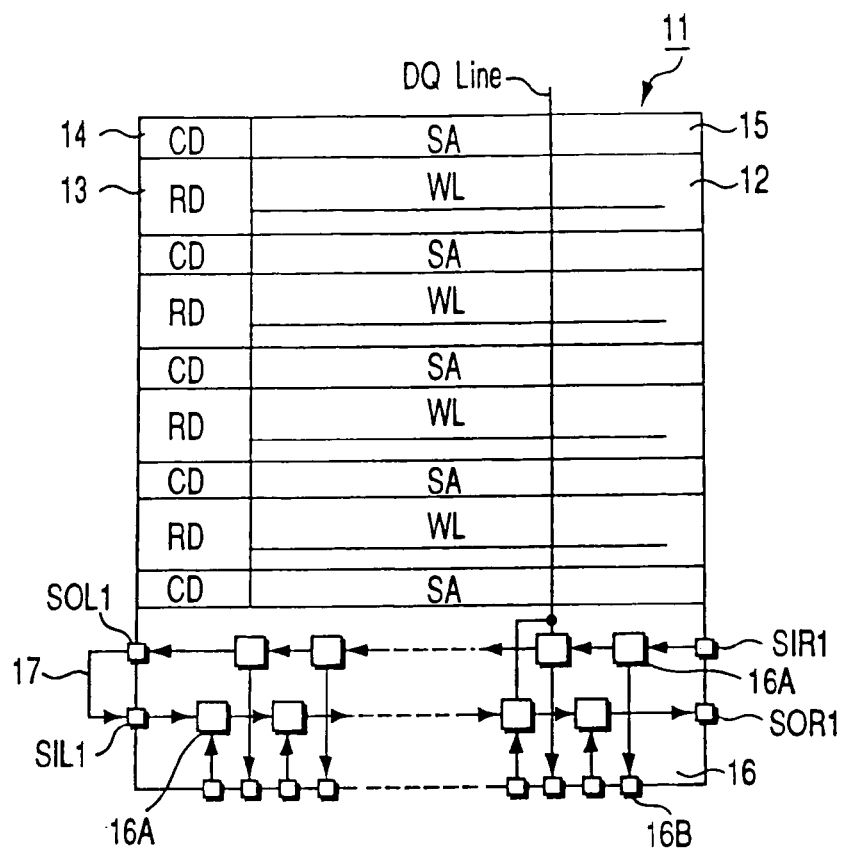
FIG. 3 is a diagram showing an array block which configures a semiconductor integrated circuit of the first embodiment of the present invention.

FIG. 3 is a diagram showing the arrangement of the array block of the first embodiment.

As shown in FIG. 3, in this array block 11, a memory cell array 12, a row decoder 13, a column decoder 14, a sense amplifier 15, and an input/output control circuit 16 are formed.

In the memory cell array 12, memory cells for storing data are arrayed in a matrix manner in the row and column directions. To select a memory cell in the row direction on the basis of an externally input row address, the row decoder 13 selects a word line WL connected to the memory cell. The sense amplifier 15 amplifies a voltage read out from the memory cell selected on the basis of the row decoder 13. To select a memory cell in the column direction on the basis of an externally input column address, the column decoder 14 selects a bit line connected to the memory cell, and connects this bit line to a DQ line. In data read, the input/output control circuit 16 transfers data stored in a memory cell to an output terminal. In data write, the input/output control circuit 16 transfers data input to an input terminal to a memory cell.

In this input/output control circuit 16, input/output registers and scan registers (to be referred to as IO registers hereinafter) 16A, input/output terminals (to be referred to as IO terminals hereinafter) 16B, a first scan input terminal SIR1, a second scan input terminal SIL1, a first scan output terminal SOL1, and a second scan output terminal SOR1 are arranged.

The first scan input terminal SIR1 is placed at the right end of the input/output control circuit 16. The first scan output terminal SOL1 is placed at the left end of the input/output circuit 16. The series-connected IO registers 16A are arranged between the first scan input terminal SIR1 and the first scan output terminal SOL1. These IO registers 16A have latching means capable of scanning, respectively, and are connected in series to form a scan chain. The IO terminal 16B is connected to each of these IO registers 16A.

The second scan input terminal SIL1 is placed at the left end of the input/output control circuit 16. The second scan output terminal SOR1 is placed at the right end of the input/output control circuit 16. The series-connected IO registers 16A are arranged between the second scan input terminal SIL1 and the second scan output terminal SOR1. These IO registers 16A have latching means capable of scanning, respectively, and are connected in series to form a scan chain. The IO terminal 16B is connected to each of these IO registers 16A. Note that the second scan input terminal SIL1 is placed near the first scan output terminal SOL1, and the second scan output terminal SOR1 is placed near the first scan input terminal SIR1.

In addition, a line 17 is connected between the first scan output terminal SOL1 and the second scan input terminal SIL1.

In the array block 11 having this configuration, input data to the scan input terminal SIR1 is scanned in the series-connected IO registers 16A in sequence, and transferred to the scan output terminal SOL1. The data transferred to the scan output terminal SOL1 is input to the scan input terminal SIL1 through the line 17. This data input to the scan input terminal SIL1 is scanned in the IO registers 16A in sequence and transferred to the scan output terminal SOR1.

As described above, the scan input terminal SIR1 is placed at the right end of the array block 11, and the scan output terminal SOL1 as an output of this scan input terminal SIR1 is placed at the left end of the array block 11. Also, the scan input terminal SIL1 is placed at the left end of the array block 11, and the scan output terminal SOR1 as an output of this scan input terminal SIL1 is placed at the right end of the array block 11. The scan output terminal SOL1 and the scan input terminal SIL1 arranged at the left end of the array block 11 are connected by the line 17. Accordingly, a scan chain can be formed between the scan input terminal SIR1 and the scan output terminal SOR1, so data input to the scan input terminal SIR1 can be scanned to the scan output terminal SOR1.

The line 17 cannot be a long line because it connects the scan output terminal SOL1 and the scan input terminal SIL1 arranged close to each other. Therefore, even when data input to the scan input terminal SIR1 is scanned to the scan output terminal SOR1, deterioration of the performance of the scan operation can be reduced.

In data read, an output from the sense amplifier 15 is stored in the IO register 16A through the DQ line, and output to the outside from the IO terminal 16B. In data write, data externally input to the IO terminal 16B is stored in the IO register 16A, and written in a selected memory cell through the DQ line.

The arrangement of a memory macro in which an operation control circuit is formed in the array block 11 will be described below.

Figure 4:
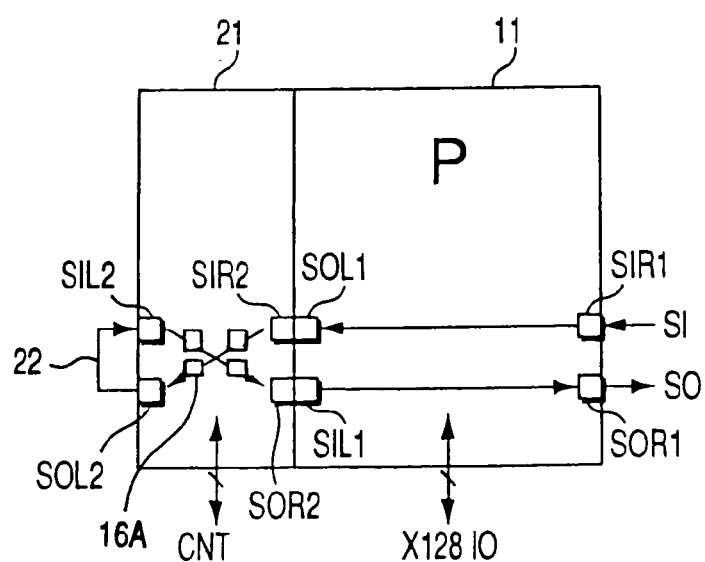
FIG. 4 is a diagram showing a memory macro which configures a semiconductor integrated circuit of the first modification of the first embodiment.

FIG. 4 is a diagram showing the arrangement of a memory macro of the first modification of the first embodiment described above.

As shown in FIG. 4, this memory macro has the array block 11 shown in FIG. 3 and an operation control circuit 21. The internal configuration of the array block 11 is the same as shown in FIG. 3. FIG. 4 shows only the scan input terminals SIR1 and SIL1 and the scan output terminals SOL1 and SOR1 in the input/output control circuit 16. In this input/output control circuit of the array block 11, 128 IO registers and 128 IO terminals are arranged.

That is, the scan input terminal SIR1 is placed at the right end of the input/output control circuit of the array block 11. The scan output terminal SOL1 is placed at the left end of this input/output control circuit. 64 series-connected IO registers are arranged between the scan input terminal SIR1 and the scan output terminal SOL1. These 64 IO registers have latching means capable of scanning, respectively, and thereby form a scan chain. An IO terminal is connected to each of these 64 IO registers.

The scan input terminal SIL1 is placed at the left end of the input/output control circuit. The scan output terminal SOR1 is placed at the right end of the input/output control circuit. 64 series-connected IO registers are arranged between the scan input terminal SIL1 and the scan output terminal SOR1. These 64 IO registers have latching means capable of scanning, respectively, and thereby form a scan chain. An IO terminal is connected to each of these 64 IO registers.

In addition, a scan input terminal SIR2 connected to the scan output terminal SOL1 is placed at the right end of the operation control circuit 21. A scan output terminal SOL2 is placed at the left end of the operation control circuit 21. A plurality of IO registers are arranged between the scan input terminal SIR2 and the scan output terminal SOL2. These IO registers have latching means capable of scanning, respectively, and thereby form a scan chain. An IO terminal is connected to each of these IO registers.

A scan input terminal SIL2 is placed at the left end of the operation control circuit 21. A scan output terminal SOR2 connected to the scan input terminal SIL1 is placed at the right end of the operation control circuit 21. A plurality of IO registers are arranged between the scan input terminal SIL2 and the scan output terminal SOR2. These IO registers have latching means capable of scanning, respectively, and thereby form a scan chain. An IO terminal is connected to each of these IO registers. A control signal CNT is input to and output from this IO terminal. Externally input control signals CNT include a clock signal and command signal. On the basis of an externally input clock signal, the operation control circuit 21 generates a clock signal to be used internally. Also, the operation control circuit 21 generates various operation signals on the basis of a command signal, and outputs these operation signals to the row decoder 13, the column decoder 14, and the input/output control circuit 16. That is, this operation control circuit 21 controls the operations of the row decoder 13, the column decoder 14, and the input/output control circuit 16 in accordance with an externally input clock signal and command signal.

Furthermore, a line 22 is connected between the scan output terminal SOL2 and the scan input terminal SIL2.

In the memory macro having this configuration, input data to the scan input terminal SIR1 is scanned in a plurality of series-connected IO registers in sequence, transferred to the scan output terminal SOL1, and then to the scan input terminal SIR2. The data transferred to the scan input terminal SIR2 is scanned in a plurality of IO registers and transferred to the scan output terminal SOL2.

The data transferred to the scan output terminal SOL2 is input to the scan input terminal SIL2 through the line 22. This data input to the scan input terminal SIL2 is scanned in a plurality of IO registers, transferred to the scan output terminal SOR2, and then to the scan input terminal SIL1. The data input to the scan input terminal SIL1 is scanned in a plurality of series-connected IO registers in sequence, and transferred to the scan output terminal SOR1.

As described above, one scan input terminal and one scan output terminal are arranged at the left end of each of the array block 11 and the operation control circuit 21. One scan input terminal and one scan input terminal are also arranged at the right end of each of the array block 11 and the operation control circuit 21. When the array block 11 and the operation control circuit 21 are juxtaposed, the scan output terminal SOL1 and the scan input terminal SIR2 are connected, and the scan output terminal SOR2 and the scan input terminal SIL1 are connected. Accordingly, even when a memory macro is constructed by the array block 11 and the operation control circuit 21, one scan input terminal and one scan output terminal are arranged at each of the right- and left-ends. In addition, the scan output terminal SOL2 and the scan input terminal SIL2 at the left end of the memory macro are connected by the line 22.

With this configuration, a memory macro scanning function can be realized by inputting data SI to be scanned to the scan input terminal SIR1 at the right end of this memory macro, and outputting scanned data SO from the scan output terminal SOR1 at the same end.

The line 22 cannot be a long line because it connects the scan output terminal SOL2 and the scan input terminal SIL2 arranged close to each other at the left end of the operation control circuit 21. Therefore, even when the data SI input to the scan input terminal SIR1 is scanned to the scan output terminal SOR1 to output the data SO, deterioration of the performance of the scan operation can be suppressed.

Next, the arrangement of a memory macro formed by adding an array block 11B to a memory macro having the array block 11 and the operation control circuit 21 will be explained below. When the operation control circuit 21 is to be shared by the two array blocks 11 and 11B, these two array blocks 11 and 11B are usually so arranged as to have a mirror inversion relationship with respect to the operation control circuit 21.

Figure 5:
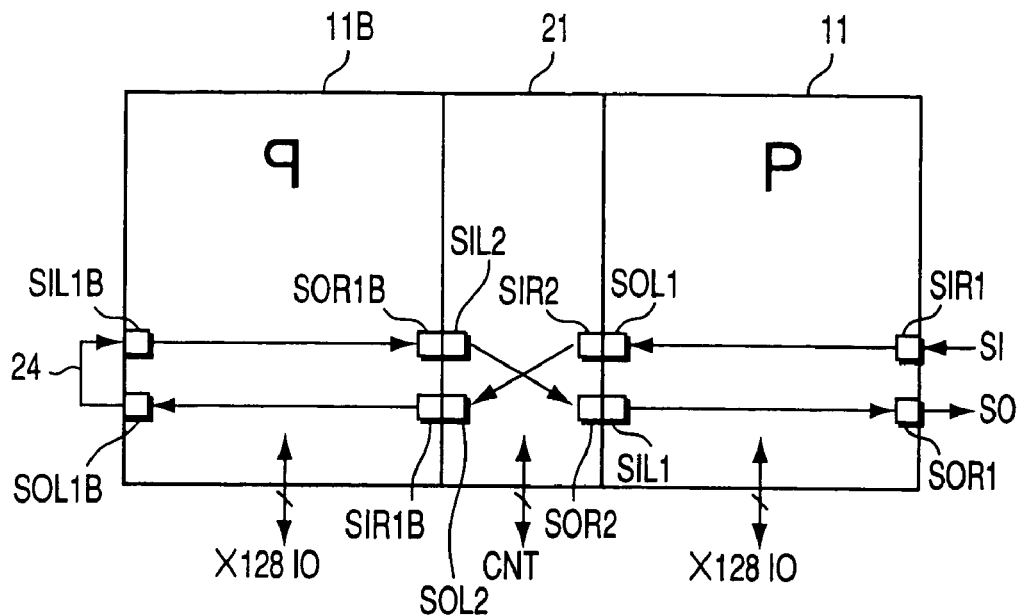
FIG. 5 is a diagram showing a memory macro which configures a semiconductor integrated circuit of the second modification of the first embodiment.

FIG. 5 is a diagram showing the arrangement of the memory macro of the second modification of the above first embodiment.

As shown in FIG. 5, this memory macro has the array block 11, the operation control circuit 21, and the array block 11B. This array block 11B is the mirror inversion of the array block 11 with respect to the operation control circuit 21. The configurations of the array block 11 and the operation control circuit 21 are the same as shown in FIG. 4.

The configuration of the array block 11B is the mirror inversion of the configuration shown in FIG. 3. FIG. 5 shows only scan input terminals SIR1B and SIL1B and scan output terminals SOL1B and SOR1B in an input/output control circuit. In this input/output control circuit of the array block 11B, 128 IO registers and 128 IO terminals are arranged.

The scan input terminal SIR1B connected to the scan output terminal SOL2 is placed at the right end of the input/output control circuit of the array block 11B. The scan output terminal SOL1B is placed at the left end of this input/output control circuit. 64 series-connected IO registers are arranged between the scan input terminal SIR1B and the scan output terminal SOL1B. These 64 IO registers have latching means capable of scanning, respectively, and thereby form a scan chain. An IO terminal is connected to each of these 64 IO registers.

The scan input terminal SIL1B is placed at the left end of the array block 11B. The scan output terminal SOR1B connected to the scan input terminal SIL2 is placed at the right end of the array block 11B. 64 series-connected IO registers are arranged between the scan input terminal SIL1B and the scan output terminal SOR1B. These 64 IO registers have latching means capable of scanning, respectively, and thereby form a scan chain. An IO terminal is connected to each of these 64 IO registers.

Furthermore, a line 24 is connected between the scan output terminal SOL1B and the scan input terminal SIL1B.

In the memory macro having this configuration, data SI input to the scan input terminal SIR1 is scanned in a plurality of series-connected IO registers in sequence, transferred to the scan output terminal SOL1, and then to the scan input terminal SIR2. This data SI transferred to the scan input terminal SIR2 is scanned in a plurality of IO registers, transferred to the scan output terminal SOL2, and then to the scan input terminal SIR1B. The data SI is further scanned in a plurality of series-connected IO registers in sequence and transferred to the scan output terminal SOL1B.

The data SI transferred to the scan output terminal SOL1B is input to the scan input terminal SIL1B through the line 24. This data SI input to the scan input terminal SIL1B is scanned in a plurality of IO registers in sequence, transferred to the scan output terminal SOR1B, and then to the scan input terminal SIL2. The data SI input to the scan input terminal SIL2 is scanned in a plurality of IO registers, transferred to the scan output terminal SOR2, and then to the scan input terminal SIL1. This data SI is further scanned in a plurality of series-connected IO registers in sequence, transferred to the scan output terminal SOR1, and output as data SO.

As described above, one scan input terminal and one scan output terminal are arranged at the left end of each of the array block 11, the operation control circuit 21, and the array block 11B. One scan input terminal and one scan input terminal are also arranged at the right end of each of the array block 11, the operation control circuit 21, and the array block 11B. When the array block 11, the operation control circuit 21, and the array block 11B are juxtaposed, the scan output terminal SOL1 and the scan input terminal SIR2 are connected. In addition, the scan output terminal SOL2 and the scan input terminal SIR1B are connected, the scan output terminal SOR1B and the scan input terminal SIL2 are connected, and the scan output terminal SOR2 and the scan input terminal SIL1 are connected. Accordingly, even when a memory macro is constructed by the array block 11, the operation control circuit 21, and the array block 11B, one scan input terminal and one scan output terminal can be arranged at each of the right- and left-ends. In addition, the scan output terminal SOL1B and the scan input terminal SIL1B at the left end of the memory macro are connected by the line 24.

With this configuration, a memory macro scanning function can be realized by inputting data SI to be scanned to the scan input terminal SIR1 at the right end of this memory macro, and outputting scanned data SO from the scan output terminal SOR1 at the same end.

The line 24 cannot be a long line because it connects the scan output terminal SOL1B and the scan input terminal SIL1B arranged close to each other at the left end of the array block 11B. Therefore, even when the data SI input to the scan input terminal SIR1 is scanned to the scan output terminal SOR1 to output the data SO, deterioration of the performance of the scan operation can be suppressed.

A configuration in which two memory macros each having the array block 11 and the operation control circuit 21 shown in FIG. 4 are juxtaposed will be explained below.

Figure 6:
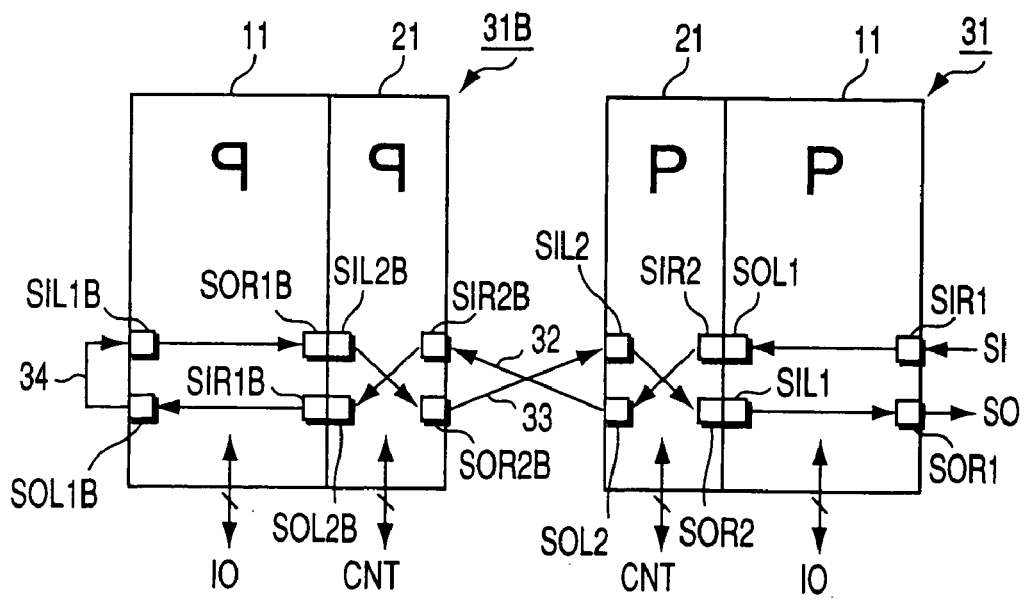
FIG. 6 is a diagram showing a memory macro which configures a semiconductor integrated circuit of the third modification of the first embodiment.

FIG. 6 is a diagram showing the arrangement of the memory macros of the third modification of the above first embodiment.

As shown in FIG. 6, a memory macro 31 having the array block 11 and the operation control circuit 21 is juxtaposed with a memory macro 31B as the mirror inversion of this memory macro 31.

The configuration of the memory macro 31 is the same as shown in FIG. 4. FIG. 6 shows only the scan input terminals SIR1 and SIL1 and the scan output terminals SOL1 and SOR1 in the input/output control circuit of the array block 11. FIG. 6 also shows the scan input terminals SIR2 and SIL2 and the scan output terminals SOL2 and SOR2 in the operation control circuit 21.

The configuration of the memory macro 31B is the mirror inversion of the configuration shown in FIG. 4. FIG. 6 shows only the scan input terminals SIR1B and SIL1B and the scan output terminals SOL1B and SOR1B in the input/output control circuit of the array block 11. FIG. 6 also shows scan input terminals SIR2B and SIL2B and scan output terminals SOL2B and SOR2B in the operation control circuit 21.

The scan output terminal SOL2 at the left end of the memory macro 31 is connected to the scan output terminal SIR2B at the right end of the memory macro 31B by a line 32. The scan output terminal SOR2B at the right end of the memory macro 31B is connected to the scan input terminal SIL2 at the left end of the memory macro 31 by a line 33. In addition, the scan output terminal SOL1B and the scan input terminal SIL1B at the left end of the memory macro 31B are connected by a line 34.

The scan input terminal SIR1 at the right end of the memory macro 31 is an input terminal for input data SI to be scanned. The scan output terminal SOR1 at the right end of the memory macro 31 is an output terminal for scanned output data SO.

With this configuration, even when a plurality of memory macros are juxtaposed, a scan chain can be readily constructed by connecting adjacent scan output and input terminals. Since this does not extend the scan chain, deterioration of the performance of the scan operation can be suppressed.

Also, the lines 32, 33, and 34 for realizing scan can be formed by an automatic wiring function by registering, in an automatic wiring tool, the scan input/output terminals SIR1/SOL2, SOR1/SIL2, SIR2B/SOL1B, and SOR2B/SIL1B arranged at the right- and left-ends of the memory macros 31 and 31B. This automatic wiring function can be used even when logic registers exist in juxtaposed memory macros. This can increase the degree of freedom of wiring formation.

In the first embodiment and its modifications as described above, it is possible to reduce performance deterioration of the scan operation caused by the formation of a long external line, and to eliminate obstacles to automatization of the scan operation.

Second Embodiment

An array block constructing a semiconductor integrated circuit of the second embodiment of the present invention will be described below. This second embodiment differs from the first embodiment in that a plurality of buffers are arranged between a second scan input terminal SIL1 and a second scan output terminal SOR1. The rest is the same as the first embodiment.

Figure 7:
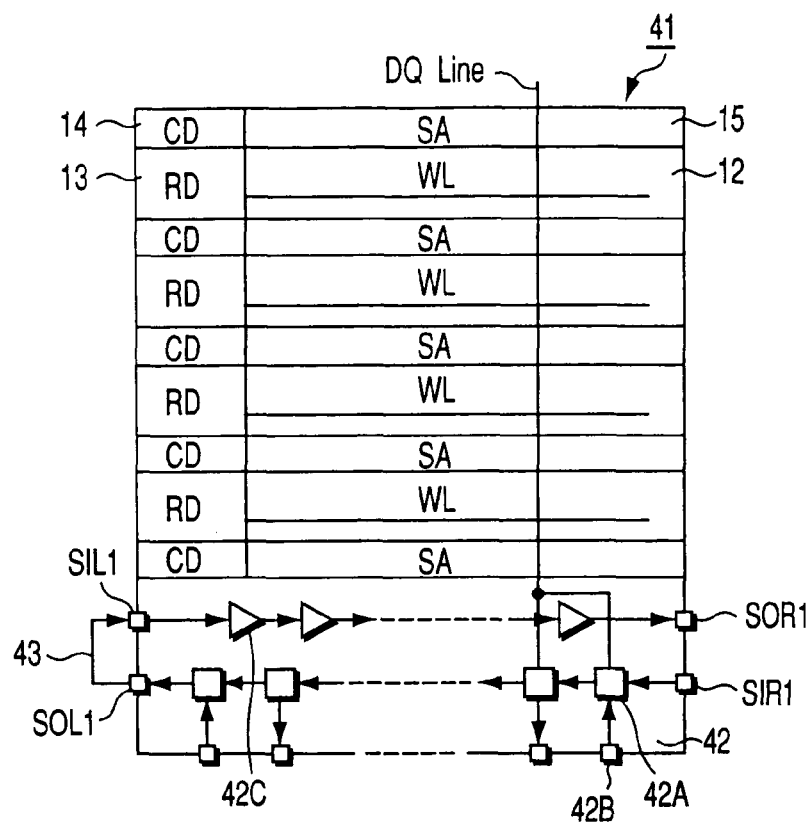
FIG. 7 is a diagram showing an array block which configures a semiconductor integrated circuit of the second embodiment of the present invention.

FIG. 7 is a diagram showing the arrangement of the array block of the second embodiment.

As shown in FIG. 7, in this array block 41, a memory cell array 12, a row decoder 13, a column decoder 14, a sense amplifier 15, and an input/output control circuit 42 are formed.

In the input/output control circuit 42, IO registers 42A, IO terminals 42B, first and second scan input terminals SIR1 and SIL1, and first and second scan output terminals SOL1 and SOR1 are arranged.

The first scan input terminal SIR1 is placed at the right end of the input/output control circuit 42. The first scan output terminal SOL1 is placed at the left end of the input/output circuit 42. The series-connected IO registers 42A are arranged between the first scan input terminal SIR1 and the first scan output terminal SOL1. These IO registers 42A have latching means capable of scanning, respectively, and are connected in series to form a scan chain. The IO terminal 42B is connected to each of these IO registers 42A.

The second scan input terminal SIL1 is placed at the left end of the input/output control circuit 42. The second scan output terminal SOR1 is placed at the right end of the input/output control circuit 42. A plurality of series-connected buffers 42C are arranged between the second scan input terminal SIL1 and the second scan output terminal SOR1. Note that the second scan input terminal SIL1 is positioned near the first scan output terminal SOL1, and the second scan output terminal SOR1 is positioned near the first scan input terminal SIR1.

In addition, a line 43 is connected between the first scan output terminal SOL1 and the second scan input terminal SIL1.

In the array block 41 having this configuration, input data to the scan input terminal SIR1 is scanned in the series-connected IO registers 42A in sequence, and transferred to the scan output terminal SOL1. The data transferred to the scan output terminal SOL1 is input to the scan input terminal SIL1 through the line 43. This data input to the scan input terminal SIL1 is further transferred to the scan output terminal SOR1 through the series-connected buffers 42C.

As described above, the scan input terminal SIR1 is placed at the right end of the array block 41, and the scan output terminal SOL1 as an output of this scan input terminal SIR1 is placed at the left end of the array block 41. Also, the scan input terminal SIL1 is placed at the left end of the array block 41, and the scan output terminal SOR1 as an output of this scan input terminal SIL1 is placed at the right end of the array block 41. The scan output terminal SOL1 and the scan input terminal SIL1 arranged at the left end of the array block 41 are connected by the line 43. Accordingly, a scan chain can be formed between the scan input terminal SIR1 and the scan output terminal SOR1, so data input to the scan input terminal SIR1 can be scanned to the scan output terminal SOR1.

The line 43 cannot be a long line because it connects the scan output terminal SOL1 and the scan input terminal SIL1 arranged close to each other. Therefore, even when data input to the scan input terminal SIR1 is scanned to the scan output terminal SOR1, deterioration of the performance of the scan operation can be suppressed.

In the second embodiment as described above, it is possible to reduce performance deterioration of the scan operation caused by the formation of a long external line, and to eliminate obstacles to automatization of the scan operation.

Third Embodiment

An array block constructing a semiconductor integrated circuit of the third embodiment of the present invention will be described below. This third embodiment differs from the first embodiment in that a scan input terminal and scan output terminal are formed near one end of the array block, and IO registers are connected by a line without forming any scan input and output terminals at the other end. The rest is the same as the first embodiment.

Figure 8:
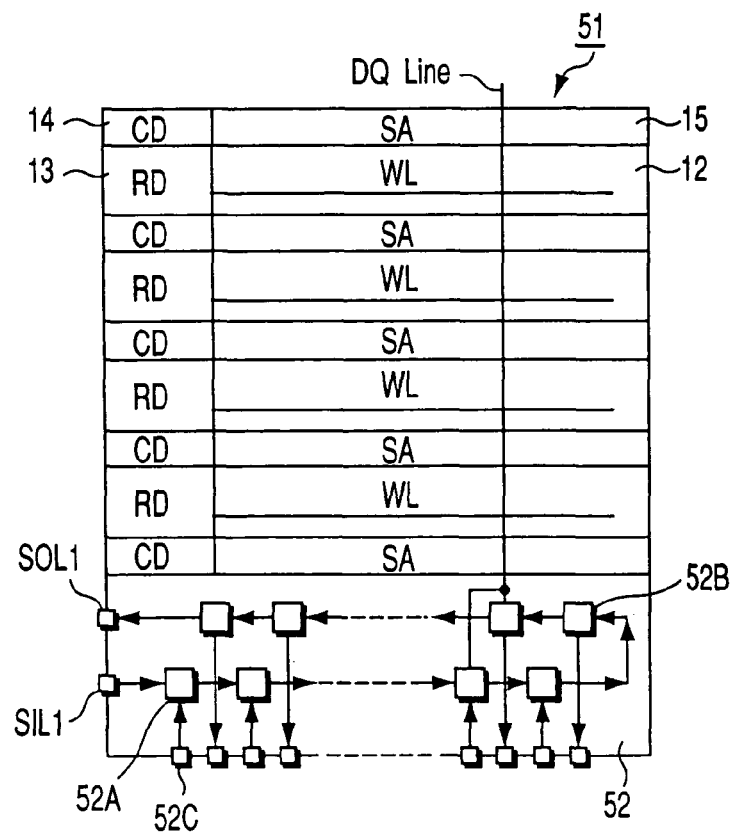
FIG. 8 is a diagram showing an array block which configures a semiconductor integrated circuit of the third embodiment of the present invention.

FIG. 8 is a diagram showing the arrangement of the array block of the third embodiment.

As shown in FIG. 8, in this array block 51, a memory cell array 12, a row decoder 13, a column decoder 14, a sense amplifier 15, and an input/output control circuit 52 are formed.

In the input/output control circuit 52, IO registers 52A, IO terminals 52B, IO terminals 52C, a scan input terminal SIL1, and a scan output terminal SOL1 are arranged.

At the left end of the input/output control circuit 52, the scan input terminal SIL1 and the scan output terminal SOL1 are arranged. One end of the series-connected IO registers 52A is connected to the scan input terminal SIL1. These IO registers 52A are arranged from the left end to the right end of the input/output control circuit 52.

Also, the IO registers 52B are connected in series and arranged from the right end to the left end of the input/output control circuit 52. The other end of the IO registers 52A is connected to one end of the IO registers 52B. The other end of the IO registers 52B is connected to the scan output terminal SOL1.

These IO registers 52A and 52B have latching means capable of scanning, respectively, and thereby form a scan chain. The IO terminal 52C is connected to each of these IO registers 52A and 52B. Note that the scan input terminal SIL1 is placed near the scan output terminal SOL1.

In the array block 51 having this configuration, input data to the scan input terminal SIL1 is scanned in the series-connected IO registers 52A and 52B in sequence, and transferred to the scan output terminal SOL1.

As described above, the scan input terminal SIL1 is placed at the left end of the array block 51, and the scan output terminal SOL1 as an output of this scan input terminal SIL1 is also placed at the left end of the array block 51. Between the scan input terminal SIL1 and the scan output terminal SOL1, the IO registers 52A and 52B are connected in series. Accordingly, a scan chain can be formed between the scan input terminal SIL1 and the scan output terminal SOL1, so data input to the scan input terminal SIL1 can be scanned to the scan output terminal SOL1.

As described above, on scan input terminal and one scan output terminal are formed near one end of an array block. Therefore, even when memory macros having various configurations are formed, it is possible to suppress performance deterioration of the scan operation caused by the formation of a long external line. In addition, since no lines need be formed outside the memory macro, obstacles to automatization of the scan operation can be eliminated.

The arrangement of a memory macro in which an operation control circuit is formed in the array block 51 will be described below.

Figure 9:
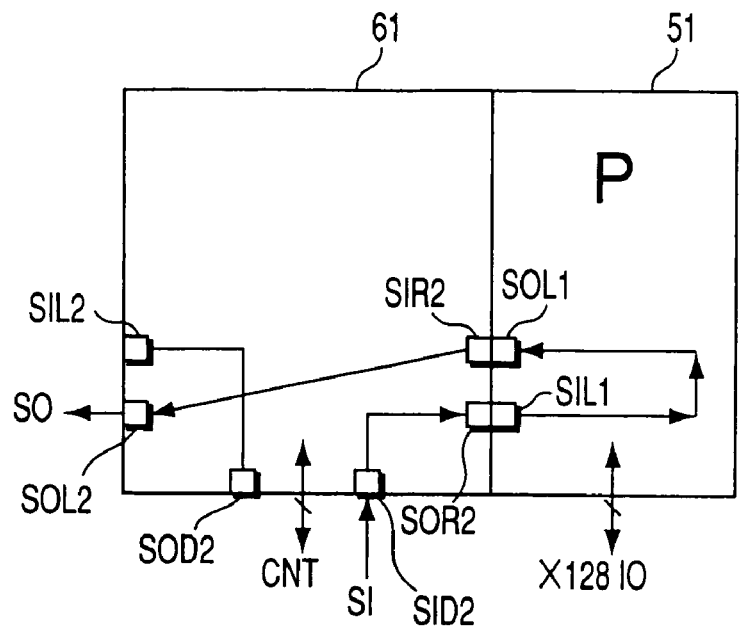
FIG. 9 is a diagram showing a memory macro which configures a semiconductor integrated circuit of the first modification of the third embodiment.

FIG. 9 is a diagram showing the arrangement of a memory macro of the first modification of the third embodiment described above.

As shown in FIG. 9, this memory macro has the array block 51 shown in FIG. 8 and an operation control circuit 61. The internal configuration of the array block 51 is the same as shown in FIG. 8. FIG. 9 shows only the scan input terminal SIL1 and the scan output terminal SOL1 in the input/output control circuit 52. In this input/output control circuit of the array block 51, 128 IO registers and 128 IO terminals are arranged.

That is, the scan input terminal SIL1 and the scan output terminal SOL1 are arranged at the left end of the input/output control circuit of the array block 51. The 128 IO registers connected in series as shown in FIG. 8 are arranged between the scan input terminal SIL1 and the scan output terminal SOL1. These 128 IO registers have latching means capable of scanning, respectively, and thereby form a scan chain. An IO terminal is connected to each of these 128 IO registers.

A scan input terminal SID2 is placed at the lower end of the operation control circuit 61. At the right end of this operation control circuit 61, a scan output terminal SOR2 connected to the scan input terminal SID2 and to the scan input terminal SIL1 is placed.

A scan input terminal SIR2 connected to the scan output terminal SOL1 is placed at the right end of the operation control circuit 61. A scan output terminal SOL2 is placed at the left end of the operation control circuit 61. A plurality of IO registers are connected between the scan input terminal SIR2 and the scan output terminal SOL2. These IO registers have latching means capable of scanning, respectively, and thereby form a scan chain. An IO terminal (not shown) is connected to each of these IO registers. This IO terminal inputs and outputs a control signal CNT.

A scan input terminal SIL2 is placed at the left end of the operation control circuit 61. A scan output terminal SOD2 connected to the scan output terminal SIL2 is placed at the lower end of the operation control circuit 61. This scan output terminal SOD2 is positioned near the scan input terminal SID2.

The scan input terminal SID2 at the lower end is for extracting the scan output terminal SOR2 at the right end to the lower end, so the scan input terminal SID2 and the scan output terminal SOR2 are merely connected by a line. Likewise, the scan output terminal SOD2 at the lower end is for extracting the scan input terminal SIL2 at the left end to the lower end, so the scan output terminal SOD2 and the scan input terminal SIL2 are merely connected by a line. Hence, all IO registers in the operation control circuit 61 are arranged between the scan input terminal SIR2 and the scan output terminal SOL2.

In the memory macro having this configuration, data SI input to the scan input terminal SID2 is transferred to the scan output terminal SOR2 and then to the scan input terminal SIL1. This data SI transferred to the scan input terminal SIL1 is scanned in a plurality of series-connected IO registers in sequence, transferred to the scan output terminal SOL1, and then to the scan input terminal SIR2. The data SI is further scanned in a plurality of IO registers and transferred to the scan output terminal SOL2.

In the above memory macro, when the array block 51 and the operation control circuit 61 are juxtaposed, the scan output terminal SOR2 and the scan input terminal SIL1 are connected, and the scan output terminal SOL1 and the scan input terminal SIR2 are connected.

With this configuration, a memory macro scanning function can be realized by inputting data SI to be scanned to the scan input terminal SID2 at the lower end of this memory macro, and outputting scanned data SO from the scan output terminal SOL2 at the left end of the memory cell. Since this memory macro functions as one scan chain, no external line need be connected. This reduces limitations on design, facilitates handling of this memory macro, and can also suppress performance deterioration of the scan operation. In addition, since no lines need be formed outside the memory macro, obstacles to automatization of the scan operation can be eliminated.

The arrangement of a memory macro formed by adding an array block 51B to a memory macro having the array block 51 and the operation control circuit 61 will be explained below. When the operation control circuit 61 is to be shared by the two array blocks 51 and 51B, these two array blocks 51 and 51B are usually so arranged as to have a mirror inversion relationship with respect to the operation control circuit 61.

Figure 10:
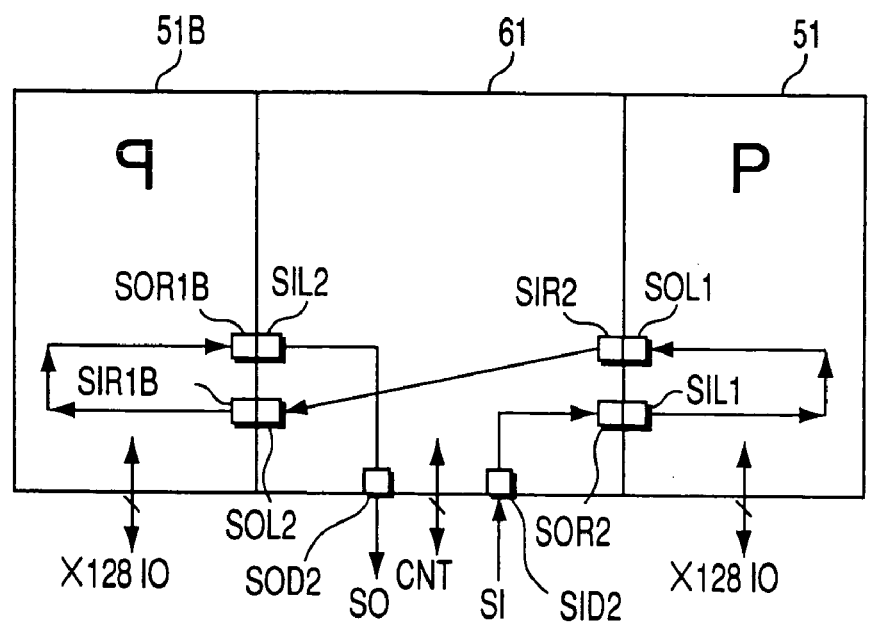
FIG. 10 is a diagram showing a memory macro which configures a semiconductor integrated circuit of the second modification of the third embodiment.

FIG. 10 is a diagram showing the arrangement of the memory macro of the second modification of the above third embodiment.

As shown in FIG. 10, this memory macro has the array block 51, the operation control circuit 61, and the array block 51B. This array block 51B is the mirror inversion of the array block 51 with respect to the operation control circuit 61. The configurations of the array block 51 and the operation control circuit 61 are the same as shown in FIG. 9.

The configuration of the array block 51B is the mirror inversion of the configuration shown in FIG. 8. FIG. 10 shows only a scan input terminal SIR1B and a scan output terminal SOR1B in an input/output control circuit. In this input/output control circuit of the array block 51B, 128 IO registers and 128 IO terminals are arranged.

The scan input terminal SIR1B connected to the scan output terminal SOL2 is placed at the right end of the input/output control circuit of the array block 51B. Similarly, the scan output terminal SOR1B connected to the scan input terminal SIL2 is placed at the right end of this input/output control circuit. Between the scan input terminal SIR1B and the scan output terminal SOR1B, the 128 IO registers connected in series as shown in FIG. 8 are arranged. These 128 IO registers have latching means capable of scanning, respectively, and thereby form a scan chain. An IO terminal is connected to each of these 128 IO registers.

In the memory macro having this configuration, data SI input to the scan input terminal SID2 is transferred to the scan output terminal SOR2 and then to the scan input terminal SIL1. This data SI transferred to the scan input terminal SIL1 is scanned in a plurality of series-connected IO registers in sequence, transferred to the scan output terminal SOL1, and then to the scan input terminal SIR2. The data SI is further scanned in a plurality of series-connected IO registers, transferred to the scan output terminal SOL2, and then to the scan input terminal SIR1B.

The data SI transferred to the scan output terminal SIR1B is scanned in a plurality of series-connected IO registers in sequence, transferred to the scan output terminal SOR1B, and then to the scan input terminal SIL2. Furthermore, the data SI input to the scan input terminal SIL2 is transferred to the scan output terminal SOD2.

In the above memory macro, when the array block 51, the operation control circuit 61, and the array block 51B are juxtaposed, the scan output terminal SOR2 and the scan input terminal SIL1 are connected. In addition, the scan output terminal SOL1 and the scan input terminal SIR2 are connected, the scan output terminal SOL2 and the scan input terminal SIR1B are connected, and the scan output terminal SOR1B and the scan input terminal SIL2 are connected.

With this configuration, a memory macro scanning function can be realized by inputting data SI to be scanned to the scan input terminal SID2 at the lower end of this memory macro, and outputting scanned data SO from the scan output terminal SOD2 at the same end. Since this memory macro functions as one scan chain, no external line need be connected. This reduces limitations on design, facilitates handling of this memory macro, and can also suppress performance deterioration of the scan operation. In addition, since no lines need be formed outside the memory macro, obstacles to automatization of the scan operation can be eliminated.

In the third embodiment and its modifications as described above, it is possible to reduce performance deterioration of the scan operation caused by the formation of a long external line, and to eliminate obstacles to automatization of the scan operation.

Fourth Embodiment

An array block constructing a semiconductor integrated circuit of the fourth embodiment of the present invention will be described below. In this fourth embodiment, to eliminate data through by hold violation between IO registers in an array block, a buffer for delaying a clock signal supplied to a preceding IO register is formed. The rest is the same as the array block configuration of the second embodiment. In addition, in this fourth embodiment, the array blocks described above are arranged to have a mirror inversion relationship with respect to an operation control circuit.

FIG. 11 is a diagram showing the arrangement of the memory macro of the fourth embodiment.

As shown in FIG. 11, this memory macro 71 has an array block 72, an operation control circuit 21, and an array block 72B. This array block 72B is the mirror inversion of the array block 72 with respect to the operation control circuit 21.

The internal configuration of the array block 72 is the same as the array block 11 shown in FIG. 3 except for an input/output control circuit 16. That is, the array block 72 has a memory cell array 12, a row decoder 13, a column decoder 14, and a sense amplifier 15. Therefore, only the internal arrangement of the input/output control circuit will be described below.

This input/output control circuit of the array block 72 has a plurality of IO registers 73 to each of which an IO terminal is connected, a plurality of buffers 75 and 76, a first scan input terminal SIR3, a first scan output terminal SOL3, a second scan input terminal SIL3, and a second scan output terminal SOR3.

The first scan input terminal SIR3 is placed at the right end of the array block 72. The first scan output terminal SOL3 is placed at the left end of the array block 72. A plurality of (e.g., 128) series-connected IO registers 73 are arranged between the first scan input terminal SIR3 and the first scan output terminal SOL3. These IO registers 73 have latching means capable of scanning, respectively, and are connected in series to form a scan chain.

A clock signal SSCLK is input to the IO register 73 in the output stage. A clock signal SSCLK passing through the buffer 75 is input to the IO register 73 in the input stage. This clock signal SSCLK is supplied from the operation control circuit 21. A plurality of (e.g., 128) IO terminals are connected to these IO registers 73.

The second scan input terminal SIL3 is placed at the left end of the array block 72. The second scan output terminal SOR3 is placed at the right end of the array block 72. A plurality of series-connected buffers 76 are arranged between the second scan input terminal SIL3 and the second scan output terminal SOR3. Note that the second scan input terminal SIL3 is positioned near the first scan output terminal SOL3, and the second scan output terminal SOR3 is positioned near the first scan input terminal SIR3.

The configuration of the array block 72B is the mirror inversion of the array block 72. That is, a plurality of (e.g., 128) series-connected IO registers 73B are arranged between a scan input terminal SIL3B and a scan output terminal SOR3B. These IO registers 73B have latching means capable of scanning, respectively, and are connected in series to form a scan chain.

A clock signal SSCLK is input to the IO register 73B in the output stage. A clock signal SSCLK passing through a buffer 75B is input to the IO register 73B in the input stage. This clock signal SSCLK is supplied from the operation control circuit 21. A plurality of (e.g., 128) IO terminals are connected to these IO registers 73B.

Also, a plurality of series-connected buffers 76B are arranged between the scan input terminal SIL3B and the scan output terminal SOL3B. Note that the scan input terminal SIR3B is positioned near the scan output terminal SOR3B, and the scan output terminal SOL3B is positioned near the scan input terminal SIL3B. In addition, a line 77 is connected between the scan output terminal SOL3B and the scan input terminal SIL3B.

The arrangement of the operation control circuit 21 is the same as shown in FIG. 4.

In the memory macro 71, no IO registers but only the buffers 76 and 76B are present in the path from the scan input terminal SIL3 to the scan output terminal SOR3 and in the path from the scan input terminal SIR3B to the scan output terminal SOL3B, respectively. Also, the IO registers 73 and 73B are present in the path from the scan input terminal SIR3 to the scan output terminal SOL3 and in the path from the scan input terminal SIL3B to the scan output terminal SOR3B, respectively.

The clock signal SSCLK described above is a clock signal for scan shift. In response to this clock signal, the IO registers 73 and 73B output stored data to subsequent IO registers.

In the memory macro 71 having this configuration, data SI input to the scan input terminal SIR3 is scanned in the series-connected IO registers 73 in sequence, transferred to the scan output terminal SOL3, and then to the scan input terminal SIR2. During the scan, an undelayed clock signal SSCLK is supplied to the IO register 73 in the subsequent stage (data receiving side), and a clock signal SSCLK delayed by the buffer 75 is supplied to the IO register 73 in the preceding stage (data transferring side). Consequently, data stored in the subsequent IO register 73 is transferred before data stored in the preceding IO register 73 is transferred. In this manner, "data through" by hold violation is prevented.

The data SI transferred to the scan input terminal SIR2 is scanned in a plurality of IO registers, transferred to the scan output terminal SOL2, and then to the scan input terminal SIR3B. This data SI transferred to the scan input terminal SIR3B is transferred to the scan output terminal SOL3B through the series-connected buffers 76B.

The data SI transferred to the scan output terminal SOL3B is input to the scan input terminal SIL3B through the line 77. This data SI input to the scan input terminal SIL3B is scanned in the series-connected IO registers 73B in sequence, transferred to the scan output terminal SOR3B, and then to the scan input terminal SIL2. During the scan, in the same manner as described above, an undelayed clock signal SSCLK is supplied to the IO register 73B in the subsequent stage, and a clock signal SSCLK delayed by the buffer 75B is supplied to the IO register 73B in the preceding stage. Consequently, data stored in the subsequent IO register 73B is transferred before data stored in the preceding IO register 73B is transferred. In this way, "data through" by hold violation is prevented.

The data SI input to the scan input terminal SIL2 is scanned in a plurality of IO registers, transferred to the scan output terminal SOR2, and then to the scan input terminal SIL3. This data SI is further transferred to the scan output terminal SOR3 through the series-connected buffers 76. As a consequence, data SO scanned in the memory macro 71 is output from the scan output terminal SOR3.

In this fourth embodiment as described above, an IO register in the succeeding stage in the data shift direction receives a clock signal before an IO register in the preceding stage. Therefore, this succeeding IO register can receive data transferred from the preceding IO register. This can eliminate "data through" by hold violation. This embodiment is an example which facilitates shift clock design for IO registers.

In each of the above embodiments, a scan input terminal and a scan output terminal are formed at the left- and right ends. However, as shown in FIG. 12, it is also possible to form a scan input terminal SIL and a scan output terminal SOL at the left end, a scan input terminal SIR and a scan output terminal SOR at the right end, a scan input terminal SIU and a scan output terminal SOU at the upper end, and a scan input terminal SID and a scan output terminal SOD at the lower end.

In the embodiments of the present invention as have been described above, it is possible to provide a semiconductor integrated circuit which, when a scan function is set for memory macros having various configurations, can reduce performance deterioration of the scan operation caused by the formation of a long external line, and can eliminate obstacles to automatization of the scan operation by eliminating lines formed outside a memory macro.

Also, the individual embodiments described above can be practiced not only singly but also in combination.

Furthermore, the above-mentioned embodiments include inventions in various stages. So, inventions in various stages can be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor integrated circuit comprising: circuits having a certain function;
   a plurality of input terminals which receive input data to said circuits from outside;
   a plurality of output terminals which output data output from said circuits to the outside;
   a plurality of first registers connected in series, said plurality of first registers shifting stored data to respective adjacent registers in sequence, and said plurality of first registers being connected in one-to-one correspondence to said plurality of input terminals or to said plurality of output terminals;
   a plurality of second registers connected in series, said plurality of second registers shifting stored data to respective adjacent registers in sequence, and said plurality of second registers being connected in one-to-one correspondence to said plurality of input terminals or to said plurality of output terminals;
   a first scan input terminal formed at one end of said plurality of first series-connected registers;
   a first scan output terminal formed at another end of said plurality of first series-connected registers, said first scan output terminal being placed at an end portion;
   a second scan input terminal formed at one end of said plurality of second series-connected registers, said second scan input terminal being placed at the end portion at which the first scan output terminal is placed; and
   a second scan output terminal formed at the other end of said plurality of second series-connected registers.

2. The semiconductor integrated circuit according to claim 1, further comprising a line formed between said first scan output terminal and said second scan input terminal.

3. The semiconductor integrated circuit according to claim 1, wherein said circuits, said plurality of input terminals, said plurality of output terminals, said plurality of first and second registers, said first scan input terminal, said first scan output terminal, said second scan input terminal, and said second scan output terminal configure a first integrated circuit, and a second integrated circuit having an arrangement which is a mirror inversion of said first integrated circuit is placed on a side of said first integrated circuit.

4. The semiconductor integrated circuit according to claim 1, wherein said circuits comprise:
   a memory cell array in which a plurality of memory cells are arrayed in row and column directions;
   a row decoder which selects said memory cells arrayed in the row direction;
   a column decoder which selects said memory cells arrayed in the column direction; and
   a sense amplifier which reads out data from a selected memory cell.

5. The semiconductor integrated circuit according to claim 1, wherein an identical data line is connected to adjacent first and second registers of said plurality of first and second registers, data is input to one of the adjacent first and second registers from the outside of the circuits, and the data is output from the other of the adjacent first and second registers to the outside of the circuits.

6. A semiconductor integrated circuit comprising:
   circuits having a certain function which are formed in a four-sided figure including first, second, third and fourth sides;
   a plurality of input terminals formed near the first side of the four-sided figure, which receive input data to said circuits from the outside;

a plurality of output terminals formed near the first side of the four-sided figure, which output data output from said circuits to the outside;

a plurality of first registers connected in series formed in the four-sided figure, said plurality of first registers shifting stored data to respective adjacent registers in sequence, and said plurality of first registers being connected in one-to-one correspondence to said plurality of input terminals or to said plurality of output terminals;

a plurality of second registers connected in series formed in the four-sided figure, said plurality of second registers shifting stored data to respective adjacent registers in sequence, and said plurality of second registers being connected in one-to-one correspondence to said plurality of input terminals or to said plurality of output terminals;

a first scan input terminal formed at one end of said plurality of first series-connected registers, said first scan input terminal being placed near the second side forming an angle with the first side;

a first scan output terminal formed at another end of said plurality of first series-connected registers, said first scan output terminal being placed near the third side opposite to the second side;

a second scan input terminal formed at one end of said plurality of second series-connected registers, said second scan input terminal being placed near the third side; and a second scan output terminal formed at another end of said plurality of second series-connected registers, said second scan output terminal being placed near the second side.

7. The semiconductor integrated circuit according to claim 6, further comprising an operation control circuit which controls operations of said circuits and said plurality of first and second registers.

8. The semiconductor integrated circuit according to claim 7, wherein said operation control circuit comprises:
   a plurality of third and fourth registers connected to input and output terminals;
   a third scan input terminal connected to one end of said plurality of third registers;
   a third scan output terminal connected to another end of said plurality of third registers;
   a fourth scan input terminal connected to one end of said plurality of fourth registers; and
   a fourth scan output terminal connected to another end of said plurality of fourth registers,
   wherein said third scan input terminal is connected to said first scan output terminal, and said fourth scan output terminal is connected to said second scan input terminal.

9. The semiconductor integrated circuit according to claim 8, wherein said third scan output terminal and said fourth scan input terminal are arranged adjacent to each other in a same end portion, and said semiconductor integrated circuit further comprises a line formed between said third scan output terminal and said fourth scan input terminal.

10. The semiconductor integrated circuit according to claim 7, wherein said circuits, said plurality of input terminals, said plurality of output terminals, said plurality of first and second registers, said first scan input terminal, said first scan output terminal, said second scan input terminal, and said second scan output terminal configure a first integrated circuit, said operation control circuit is placed adjacent to said first integrated circuit, and a second integrated circuit having an arrangement which is a mirror inversion of said first integrated circuit is placed on a side of said operation control circuit away from a side at which said first integrated circuit is formed.

11. The semiconductor integrated circuit according to claim 6, wherein said circuits comprise:
   a memory cell array in which a plurality of memory cells are arrayed in row and column directions;
   a row decoder which selects said memory cells arrayed in the row direction;
   a column decoder which selects said memory cells arrayed in the column direction; and
   a sense amplifier which reads out data from a selected memory cell.

12. The semiconductor integrated circuit according to claim 6, wherein an identical data line is connected to adjacent first and second registers of said plurality of first and second registers, data is input to one of the adjacent first and second registers from the outside of the circuits, and the data is output from the other of the adjacent first and second registers to the outside of the circuits.

13. A semiconductor integrated circuit comprising:
   a first integrated circuit including:
      circuits having a certain function;
      a plurality of input terminals which receive input data to said circuits from outside;
      a plurality of output terminals which output data output from said circuits to the outside;
      a plurality of first registers connected in series, said plurality of first registers shifting stored data to respective adjacent registers in sequence, and said plurality of first registers being connected in one-to-one correspondence to said plurality of input terminals or to said plurality of output terminals;
      a plurality of second registers connected in series, said plurality of second registers shifting stored data to respective adjacent registers in sequence, and said plurality of second registers being connected in one-to-one correspondence to said plurality of input terminals or to said plurality of output terminals;
      a first scan input terminal formed at one end of said plurality of first series-connected registers;
      a first scan output terminal formed at the other end of said plurality of first series-connected registers, said first scan output terminal being placed at an end portion;
      a second scan input terminal formed at one end of said plurality of second series-connected registers, said second scan input terminal being placed at the end portion at which the first scan output terminal is placed; and
      a second scan output terminal formed at another end of said plurality of second series-connected registers,
   a first operation control circuit placed adjacent to one end of said first integrated circuit, said first operation control circuit controlling operations of said circuits and said plurality of first and second registers;
   a second integrated circuit having an arrangement which is a mirror inversion of said first integrated circuit with respect to a straight line passing through a region which is outside of the first operation control circuit and which is located away from a side at which the first integrated circuit is formed; and
   a second operation control circuit having an arrangement which is a mirror inversion of the first operation control circuit with respect to the straight line.

14. The semiconductor integrated circuit according to claim 13, wherein said first operation control circuit comprises:
   a plurality of third and fourth registers connected to the input and output terminals;
   a third scan input terminal connected to one end of said plurality of third registers;
   a third scan output terminal connected to another end of said plurality of third registers;
   a fourth scan input terminal connected to one end of said plurality of fourth registers; and
   a fourth scan output terminal connected to another end of said plurality of fourth registers,
   wherein said third scan input terminal is connected to said first scan output terminal, and said fourth scan output terminal is connected to said second scan input terminal.

15. The semiconductor integrated circuit according to claim 14, wherein said third scan output terminal and said fourth scan input terminal are arranged adjacent to each other in a same end portion.

16. The semiconductor integrated circuit according to claim 15, wherein said second operation control circuit includes a fifth scan input terminal and a fifth scan output terminal, and said semiconductor integrated circuit further comprises a first line connecting said third scan output terminal and said fifth scan input terminal and a second line connecting said fifth scan output terminal and said fourth scan input terminal.

17. The semiconductor integrated circuit according to claim 16, wherein said first line and said second line cross.

18. The semiconductor integrated circuit according to claim 13, wherein said circuits comprise:
   a memory cell array in which a plurality of memory cells are arrayed in row and column directions;
   a row decoder which selects said memory cells arrayed in the row direction;
   a column decoder which selects said memory cells arrayed in the column direction; and
   a sense amplifier which reads out data from a selected memory cell.

19. The semiconductor integrated circuit according to claim 13, wherein an identical data line is connected to adjacent first and second registers of said plurality of first and second registers, data is input to one of the adjacent first and second registers from the outside of the circuits, and the data is output from the other of the adjacent first and second registers to the outside of the circuits.

20. A semiconductor integrated circuit comprising:
   circuits having a certain function;
   a plurality of input terminals which receive input data to said circuits from outside;
   a plurality of output terminals which output data output from said circuits to the outside;
   a plurality of first registers connected in series, said plurality of first registers shifting stored data to respective adjacent registers in sequence, and said plurality of first registers being connected in one-to-one correspondence to said plurality of input terminals or said plurality of output terminals;
   a plurality of second registers connected in series, said plurality of second registers shifting stored data to respective adjacent registers in sequence, and said plurality of second registers being connected in one-to-one correspondence to said plurality of input terminals or said plurality of output terminals;
   a first scan input terminal formed at one end of said plurality of first series-connected registers, said first scan input terminal being placed at an end portion;
   a first scan output terminal formed at one end of said plurality of second series-connected registers, said first scan output terminal being placed at the end portion at which the first scan input terminal is placed;
   a line formed between another end of said plurality of first series-connected registers and another end of said plurality of second series-connected registers; and
   an operation control circuit formed in a four-sided figure including first, second, third and fourth sides, which controls operations of said circuits and said plurality of first and second registers, said first side of the four-sided figure in which the operation control circuit is formed being placed adjacent to the end portion at which the first scan input terminal and first scan output terminal are placed, said operation control circuit including a second scan input terminal connected to the first scan input terminal and a second scan output terminal connected to the first scan output terminal, and said second scan output terminal being placed near the second side opposite to the first side.

21. The semiconductor integrated circuit according to claim 20, wherein the operation control circuit includes a third scan input terminal placed near the second side different from the first side, a third scan output terminal placed near the third side and a line connecting the third scan input terminal and the third scan output terminal.

22. The semiconductor integrated circuit according to claim 20, wherein said circuits, said plurality of input terminals, said plurality of output terminals, said plurality of first and second registers, said first scan input terminal, said first scan output terminal, and said line configure a first integrated circuit, and a second integrated circuit having an arrangement which is a mirror inversion of said first integrated circuit is placed on a side of said operation control circuit away from a side at which said first integrated circuit is formed.

23. The semiconductor integrated circuit according to claim 20, wherein said circuits comprise:
   a memory cell array in which a plurality of memory cells are arrayed in row and column directions;
   a row decoder which selects said memory cells arrayed in the row direction;
   a column decoder which selects said memory cells arrayed in the column direction; and
   a sense amplifier which reads out data from a selected memory cell.

24. The semiconductor integrated circuit according to claim 20, wherein an identical data line is connected to adjacent first and second registers of said plurality of first and second registers, data is input to one of the adjacent first and second registers from the outside of the circuits, and the data is output from the other of the adjacent first and second registers to the outside of the circuits.

25. A semiconductor integrated circuit comprising:
   a first integrated circuit including:
      circuits having a certain function;
      a plurality of input terminals which receive input data to said circuits from outside;
      a plurality of output terminals which output data output from said circuits to the outside;
      a plurality of first registers connected in series, said plurality of first registers shifting stored data to respective adjacent registers in sequence, and said plurality of first registers being connected in one-toone correspondence to said plurality of input terminals or to said plurality of output terminals;

a plurality of second registers connected in series, said plurality of second registers shifting stored data to respective adjacent registers in sequence, and said plurality of second registers being connected in one-to-one correspondence to said plurality of input terminals or to said plurality of output terminals;

a first scan input terminal formed at one end of said plurality of first series-connected registers, said first scan input terminal being placed at an end portion;

a first scan output terminal formed at one end of said plurality of second series-connected registers, said first scan output terminal being placed at the end portion at which the first scan input terminal is placed; and a line formed between another end of the plurality of first series-connected registers and another end of the plurality of second series-connected registers, an operation control circuit placed adjacent to one end of said first integrated circuit, said operation control circuit controlling operations of said circuits and said plurality of first and second registers; and a second integrated circuit having an arrangement which is a mirror inversion of said first integrated circuit, said second integrated circuit being placed on a side of said operation control circuit away from a side at which said first integrated circuit is formed.

26. The semiconductor integrated circuit according to claim 25, wherein said operation control circuit includes:
a second scan input terminal to which data is input;
a second scan output terminal connected to the second scan input terminal;
a plurality of second input terminals which input data;
a plurality of second output terminals which output data;
a plurality of third registers connected in series, said plurality of third registers shifting stored data to respective adjacent registers in sequence, and said plurality of third registers being connected in one-to-one correspondence to said plurality of second input terminals or to said plurality of second output terminals;
a third scan input terminal connected to one end of said plurality of third registers; and
a third scan output terminal connected to another end of said plurality of third registers,
wherein said second scan output terminal is connected to said first scan input terminal, and said third scan input terminal is connected to said first scan output terminal.

27. The semiconductor integrated circuit according to claim 25, wherein said operation control circuit comprises:
a memory cell array in which a plurality of memory cells are arrayed in row and column directions;
a row decoder which selects said memory cells arrayed in the row direction;
a column decoder which selects said memory cells arrayed in the column direction; and
a sense amplifier which reads out data from a selected memory cell.

28. The semiconductor integrated circuit according to claim 25, wherein an identical data line is connected to adjacent first and second registers of said plurality of first and second registers, data is input to one of the adjacent first and second registers from the outside of the circuits, and the data is output from the other of the adjacent first and second registers to the outside of the circuits.

29. A semiconductor integrated circuit comprising:
circuits having a certain function;
a plurality of input terminals which receive input data to said circuits from outside;
a plurality of output terminals which output data output from said circuits to the outside;
a plurality of first registers connected in series, said plurality of first registers shifting stored data to respective adjacent registers in sequence, and said plurality of first registers being connected in one-to-one correspondence to said plurality of input terminals or to said plurality of output terminals;
a plurality of second registers connected in series, said plurality of second registers shifting stored data to respective adjacent registers in sequence, and said plurality of second registers being connected in one-to-one correspondence to said plurality of input terminals or to said plurality of output terminals;
a first scan input terminal formed at one end of said plurality of first series-connected registers, said first scan input terminal being placed at an end portion;
a first scan output terminal formed at one end of said plurality of second series-connected registers, said first scan output terminal being placed at the end portion at which the first scan input terminal is placed; and
a line formed between another end of the plurality of first series-connected registers and another end of the plurality of second series-connected registers,
wherein an identical data line is connected to adjacent first and second registers of said plurality of first and second registers, data is input to one of the adjacent first and second registers from the outside of the circuits, and the data is output from the other of the adjacent first and second registers to the outside of the circuits.

30. The semiconductor integrated circuit according to claim 29, further comprising an operation control circuit which controls operations of said circuits and said plurality of first and second registers.

31. The semiconductor integrated circuit according to claim 30, wherein said operation control circuit comprises:
a second scan input terminal to which data is input;
a second scan output terminal connected to the second scan input terminal;
a plurality of third registers connected to both an input terminal and an output terminal;
a third scan input terminal connected to one end of said plurality of third registers; and
a third scan output terminal connected to another end of said plurality of third registers,
wherein said second scan output terminal is connected to said first scan input terminal, and said third scan input terminal is connected to said first scan output terminal.

32. The semiconductor integrated circuit according to claim 30, wherein said circuits, said plurality of input terminals, said plurality of output terminals, said plurality of first and second registers, said first scan input terminal, said first scan output terminal, and said line configure a first integrated circuit, and a second integrated circuit having an arrangement which is a mirror inversion of said first integrated circuit is placed on a side of said operation control circuit away from a side at which said first integrated circuit is formed.

33. The semiconductor integrated circuit according to claim 29, wherein said circuits comprise:
  a memory cell array in which a plurality of memory cells are arrayed in row and column directions;
  a row decoder which selects said memory cells arrayed in the row direction;
  a column decoder which selects said memory cells arrayed in the column direction; and
  a sense amplifier which reads out data from a selected memory cell.

* * * * *